(12) United States Patent
Chen et al.

(10) Patent No.: US 11,626,346 B2
(45) Date of Patent: Apr. 11, 2023

(54) LIQUID-COOLING RADIATOR MODULE

(71) Applicant: Auras Technology Co., Ltd., New Taipei (TW)

(72) Inventors: Chien-Yu Chen, New Taipei (TW); Tian-Li Ye, New Taipei (TW); Yu Chen, New Taipei (TW); Chien-An Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 144 days.

(21) Appl. No.: 17/125,510

(22) Filed: Dec. 17, 2020

(65) Prior Publication Data

US 2021/0305129 A1     Sep. 30, 2021

Related U.S. Application Data

(60) Provisional application No. 63/000,511, filed on Mar. 27, 2020.

(30) Foreign Application Priority Data

Dec. 8, 2020 (TW) ................................ 109143308

(51) Int. Cl.
| | | |
|---|---|---|
| H01L 23/473 | (2006.01) | |
| F28D 1/053 | (2006.01) | |
| H05K 7/20 | (2006.01) | |

(52) U.S. Cl.
CPC ........ H01L 23/473 (2013.01); F28D 1/05383 (2013.01); H05K 7/20263 (2013.01)

(58) Field of Classification Search
CPC ............. F28D 1/05383; F28D 1/05391; F28D 1/05375; F28D 1/05366; F28D 1/0535; F28D 1/0417; F28F 1/22; F28F 9/0209; F28F 9/0212; F28F 9/02; F28F 7/02
See application file for complete search history.

(56) References Cited

U.S. PATENT DOCUMENTS

| | | | | |
|---|---|---|---|---|
| 6,076,596 | A * | 6/2000 | Osakabe ............... | H01L 23/427 165/104.21 |
| 2006/0048930 | A1* | 3/2006 | Ozaki ...................... | F28F 9/18 165/173 |
| 2006/0237166 | A1* | 10/2006 | Otey ........................ | F28F 3/02 165/170 |

(Continued)

*Primary Examiner* — Adam B Dravininkas
(74) *Attorney, Agent, or Firm* — Muncy, Geissler, Olds & Lowe, P.C.

(57) ABSTRACT

A liquid-cooling radiator module includes a first reservoir, a second reservoir, a heat dissipation stacked structure, a radiator inlet and a radiator outlet. The first reservoir includes a first chamber and a second chamber. The second reservoir includes a third chamber and a fourth chamber. A fin tube layer of the heat dissipation stacked structure is sandwiched between the first reservoir and the second reservoir. The radiator inlet is connected to the first reservoir and the first chamber. The radiator outlet is connected to the second reservoir and the fourth chamber. A part of fin tubes of the fin tube layer communicates with the first chamber and the third chamber, another part of the fin tubes communicates with the third chamber and the second chamber, and one another part of the fin tubes communicates with the second chamber and the fourth chamber.

10 Claims, 7 Drawing Sheets

(56) References Cited

U.S. PATENT DOCUMENTS

| | | | | |
|---|---|---|---|---|
| 2007/0044948 A1* | 3/2007 | Lu | ............... | F28D 1/05375 |
| | | | | 257/E23.098 |
| 2012/0037346 A1* | 2/2012 | Kim | ............... | F28F 13/06 |
| | | | | 165/149 |
| 2012/0222848 A1* | 9/2012 | Sicks | ............... | F28F 9/0224 |
| | | | | 165/173 |
| 2013/0299139 A1* | 11/2013 | Mounioloux | ....... | F28D 1/05375 |
| | | | | 165/120 |
| 2014/0251579 A1* | 9/2014 | Sloss | ............... | F28F 27/02 |
| | | | | 165/96 |
| 2020/0033064 A1* | 1/2020 | Dziubinschi | ........ | F28D 1/05391 |

* cited by examiner

LIQUID-COOLING RADIATOR MODULE

RELATED APPLICATIONS

This application claims priority to U.S. Provisional Application Ser. No. 63/000,511, filed Mar. 27, 2020, and Taiwanese Application Serial Number 109143308 filed Dec. 8, 2020, which are herein incorporated by reference.

BACKGROUND

Field of Disclosure

The present disclosure relates to a heat dissipation module. More particularly, the present disclosure relates to a liquid-cooling radiator module.

Description of Related Art

With increasing development of science technology, various electrical devices (e.g., notebook computers, desktop computers and network servers etc.) have become indispensable roles in the daily lives of people. Generally, during the operation of the electrical devices, temperatures of electrical components arranged inside the electrical devices will gradually increase so as to damage the electrical components. Therefore, each of the electrical devices is needed to be equipped with a heat dissipating mechanism for solving these problems. One of conventional heat dissipating mechanisms normally is practiced with a fan that is used to produce airflow to cool the electrical component through convection, or a heat dissipating unit with special material that is attached on the electrical component to thermally dissipate and conduct. Also, a liquid-cooling heat dissipation mechanism is another effective and common one of the conventional heat dissipating mechanisms.

Generally speaking, the principle of the liquid-cooling heat dissipation mechanism is to perform a continuous thermal-dissipating circulation in an operation system using liquid (e.g. water or coolant) as a heat dissipation medium by continuously operating pumps. The liquid can flow in closed pipelines, and these closed pipelines are distributed on the surface of the electrical components (e.g., central processing unit) in the operation system. When liquid with relatively low temperature flows over the electrical components with relatively high temperature, the liquid absorbs heat energy to slow down the elevation of the temperature. Next, the heat energy of the liquid can be thermally exchanged by exterior or other heat dissipating mechanism through the closed pipeline for decreasing the temperature.

However, because the internal space of general computer equipment, host or server equipment is not much, it can only be practiced in the original space of the environment. Furthermore, the liquid-cooling heat dissipation mechanism must be installed with pipeline having inflow and outflow design, which makes the installation of the pipeline relatively complicated.

Therefore, there is a need to design a liquid-cooling heat dissipation module with enhanced heat-dissipating efficacy for achieving the main purpose of development, that is able to collectively allocate overall pipeline configuration, reduce the occupied space of the piping system to arrange the construction in a narrow environment, and effectively complete the connection with other pipelines to avoid water leakage.

SUMMARY

One aspect of the present disclosure is to provide a liquid-cooling radiator module to solve the aforementioned problems of the prior art.

In one embodiment of the present disclosure, a liquid-cooling radiator module is provided, and includes a first reservoir, a second reservoir, a heat dissipation stacked structure, a radiator inlet and a radiator outlet. The first reservoir includes a first chamber and a second chamber. The second reservoir includes a third chamber and a fourth chamber. The heat dissipation stacked structure includes at least one fin tube layer that is sandwiched between the first reservoir and the second reservoir. The fin tube layer includes a plurality of fin tubes which are parallel to each other. The radiator inlet is connected to the first reservoir and communicated with the first chamber. The radiator outlet is connected to the second reservoir and communicated with the fourth chamber. A first part of the fin tubes respectively communicates with the first chamber and the third chamber, a second part of the fin tubes respectively communicates with the third chamber and the second chamber, and a third part of the fin tubes respectively communicates with the second chamber and the fourth chamber.

According to one or more embodiments of the present disclosure, in the liquid-cooling radiator module, the first chamber, the first part of the fin tubes, the third chamber, the second part of the fin tubes, the second chamber, the third part of the fin tubes and the fourth chamber are collectively formed to be an S-type flow path between the first reservoir and the second reservoir.

According to one or more embodiments of the present disclosure, in the liquid-cooling radiator module, the second part of the fin tubes is located between the first part and the third part of the fin tubes.

According to one or more embodiments of the present disclosure, in the liquid-cooling radiator module, a length of the first chamber is different to a length of the third chamber, and a length of the second chamber is different to a length of the fourth chamber.

According to one or more embodiments of the present disclosure, in the liquid-cooling radiator module, the second reservoir further includes an outlet channel, and the outlet channel is located below the third chamber and in communication with the fourth chamber and the radiator outlet.

According to one or more embodiments of the present disclosure, in the liquid-cooling radiator module, the radiator inlet and the radiator outlet are collectively disposed at the same side of the liquid-cooling radiator module.

According to one or more embodiments of the present disclosure, in the liquid-cooling radiator module, the fin tube layer is plural in number, and the fin tube layers are stacked with each other. A long axis direction of each of the fin tube layers is orthogonal to a long axis direction of the first reservoir.

According to one or more embodiments of the present disclosure, in the liquid-cooling radiator module, the heat dissipation stacked structure includes a plurality of heat dissipation fin sets sandwiched between the first reservoir and the second reservoir, and each of the fin tube layers are stacked between any two neighboring ones of the heat dissipation fin sets.

According to one or more embodiments of the present disclosure, in the liquid-cooling radiator module, each of the heat dissipation fin sets includes a plurality of fins which are spaced arranged one another. An airflow channel is formed between any two neighboring ones of the fins, and a long axis direction of each of the airflow channel is parallel to a long axis direction of the first reservoir.

According to one or more embodiments of the present disclosure, the liquid-cooling radiator module includes an upper cover and a lower cover. The first reservoir, the second reservoir and the fin tube layer of the heat dissipation stacked structure are sandwiched between the upper cover and the lower cover.

According to one or more embodiments of the present disclosure, in the liquid-cooling radiator module, the first reservoir includes a plurality of reinforcement ribs, and the reinforcement ribs are spaced arranged on an inner side of the first chamber and an inner side of the second chamber.

Thus, through the construction of the embodiments above, In addition to achieving good heat dissipation efficiency, the present disclosure is also beneficial to be applied to related computer equipment, host or server equipment.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1A:
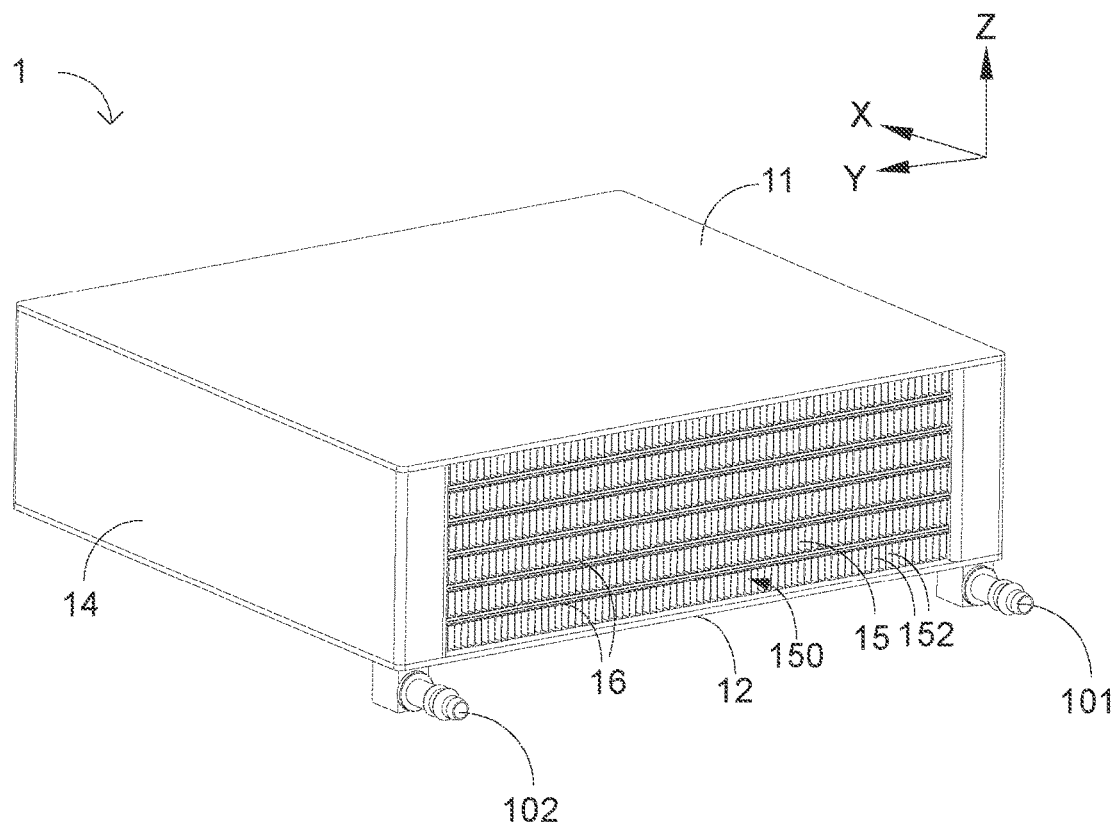
FIG. 1A is a perspective view of a liquid-cooling radiator module according to one embodiment of the present disclosure.
Figure 1B:
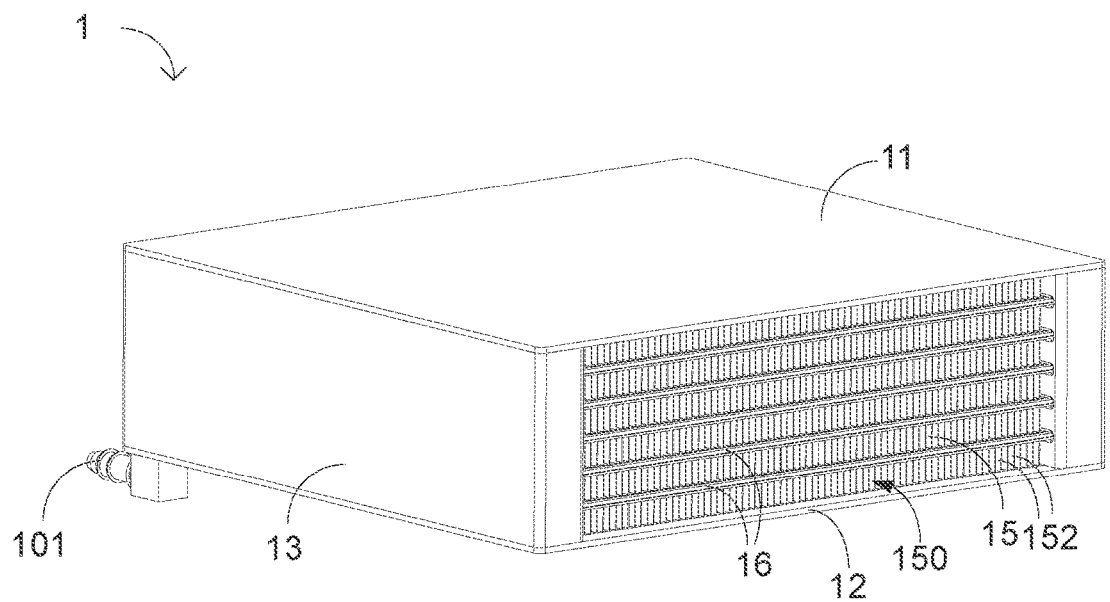
FIG. 1B is a perspective view of the liquid-cooling radiator module viewed from another viewing angle according to one embodiment of the present disclosure.
Figure 1C:
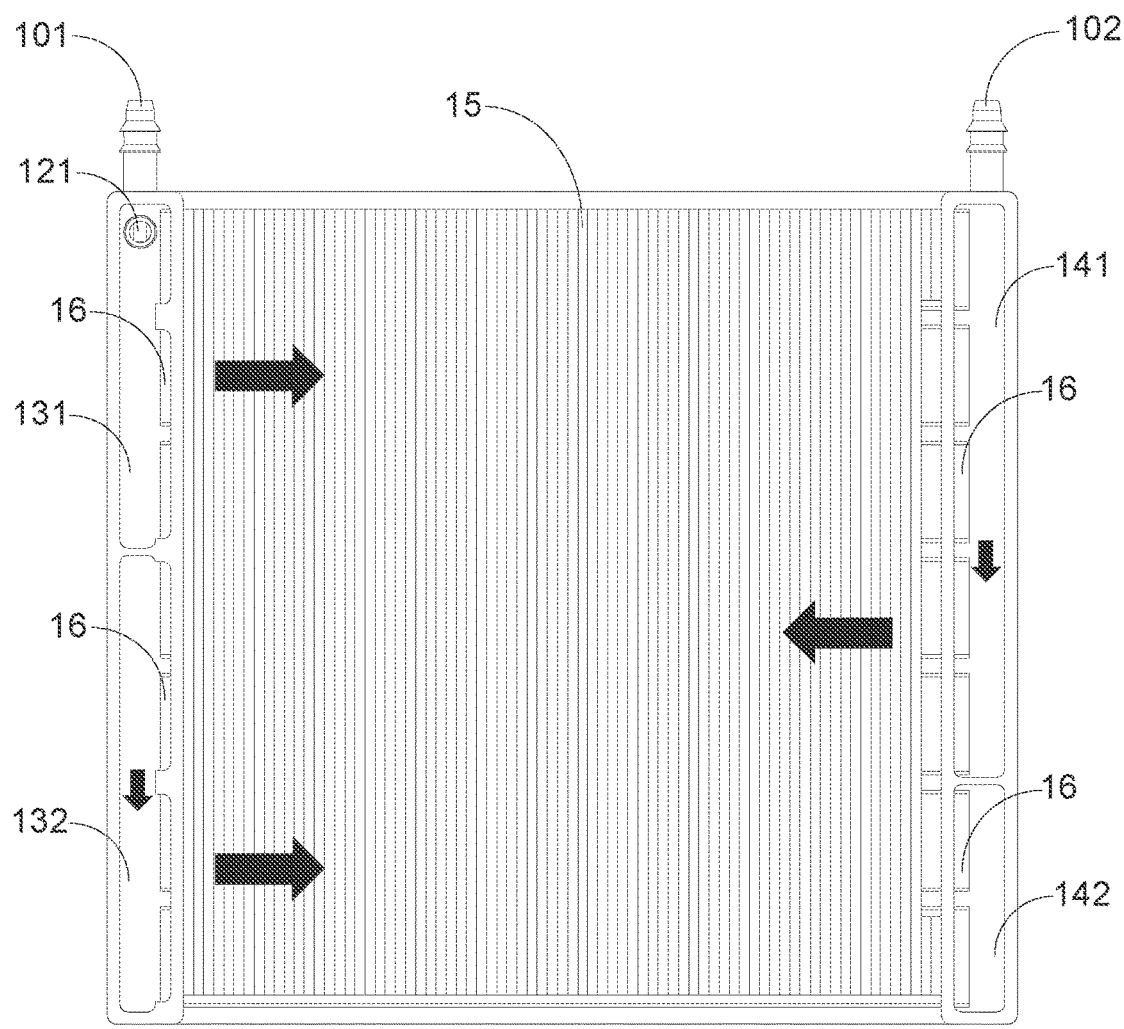
FIG. 1C is a top view of the liquid-cooling radiator module.
Figure 2A:
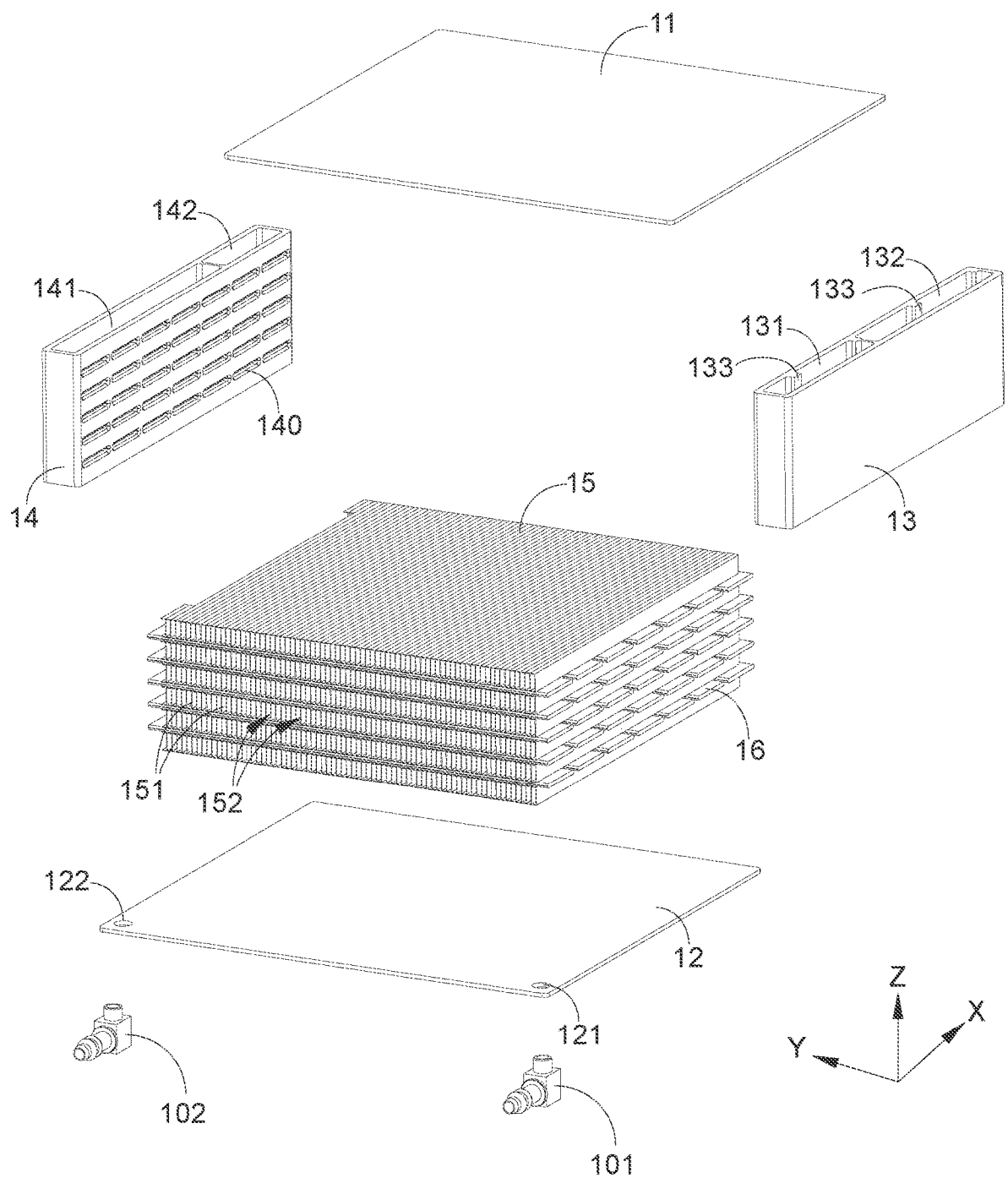
FIG. 2A is an exploded view of the liquid-cooling radiator module.
Figure 2B:
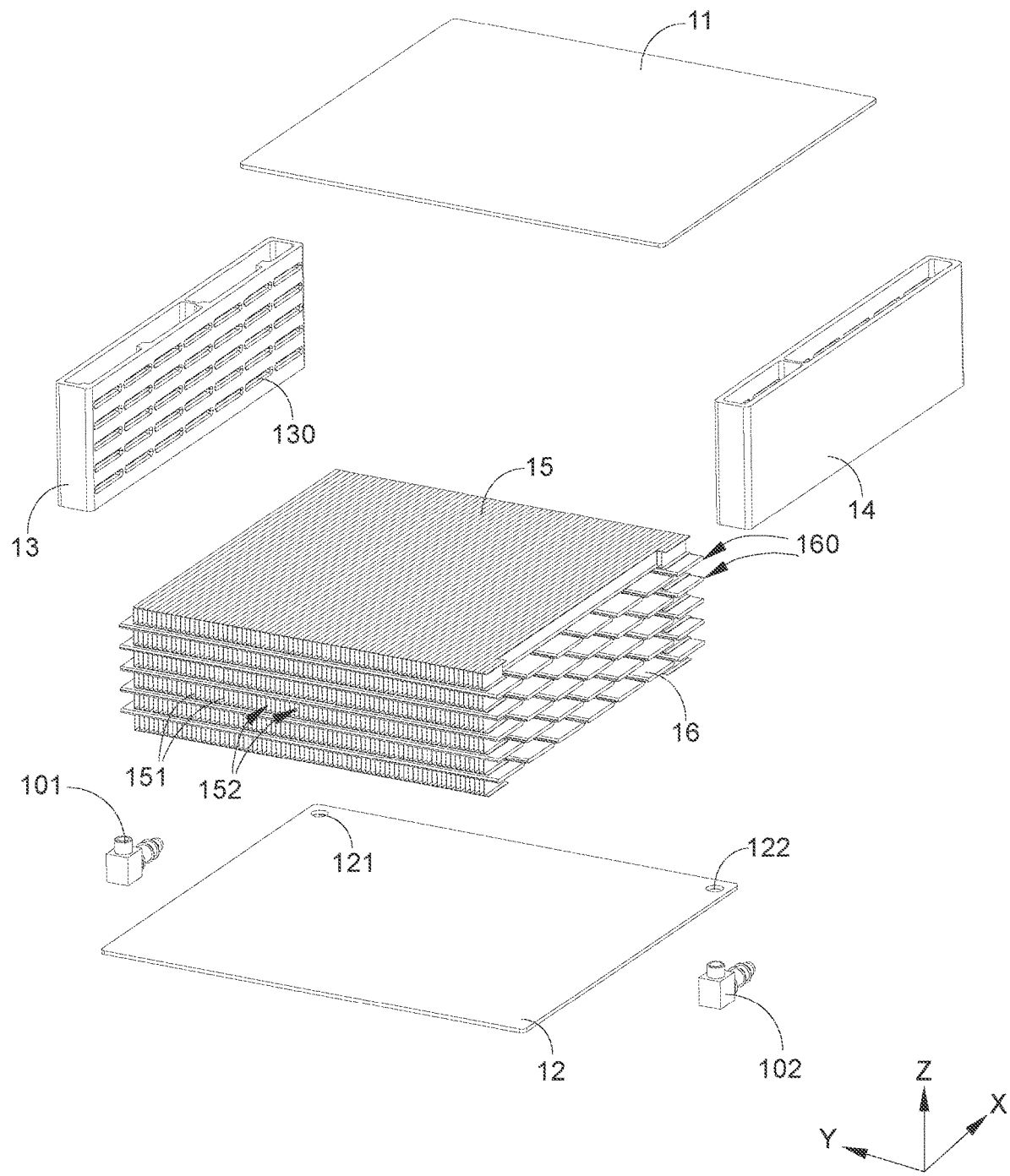
FIG. 2B is a schematic view of the liquid-cooling radiator module viewed from another viewing angle in FIG. 2A.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 3A:
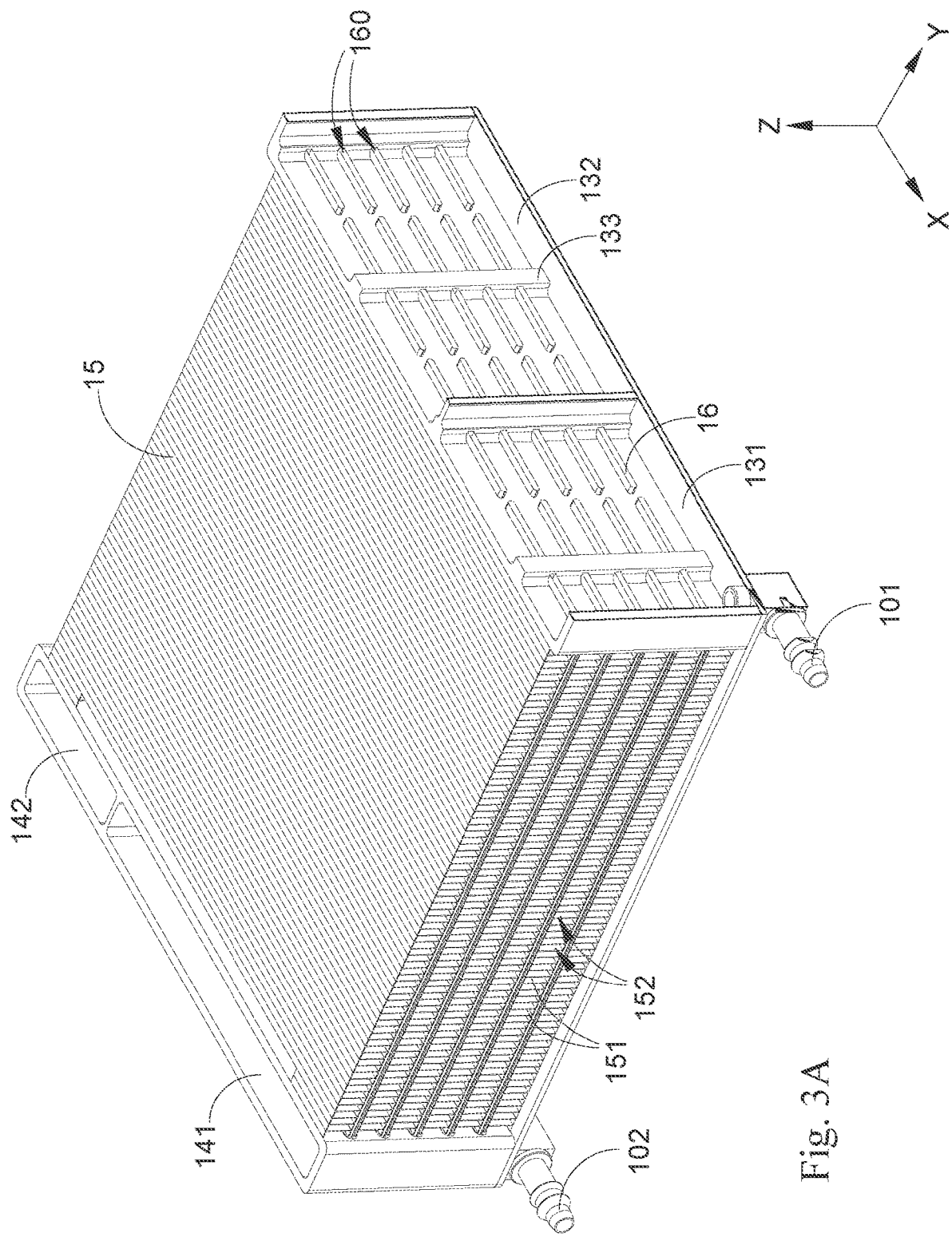
FIG. 3A is a perspective cross-sectional view of the liquid-cooling radiator module being sectioned from one side of the liquid-cooling radiator module.
Figure 3B:
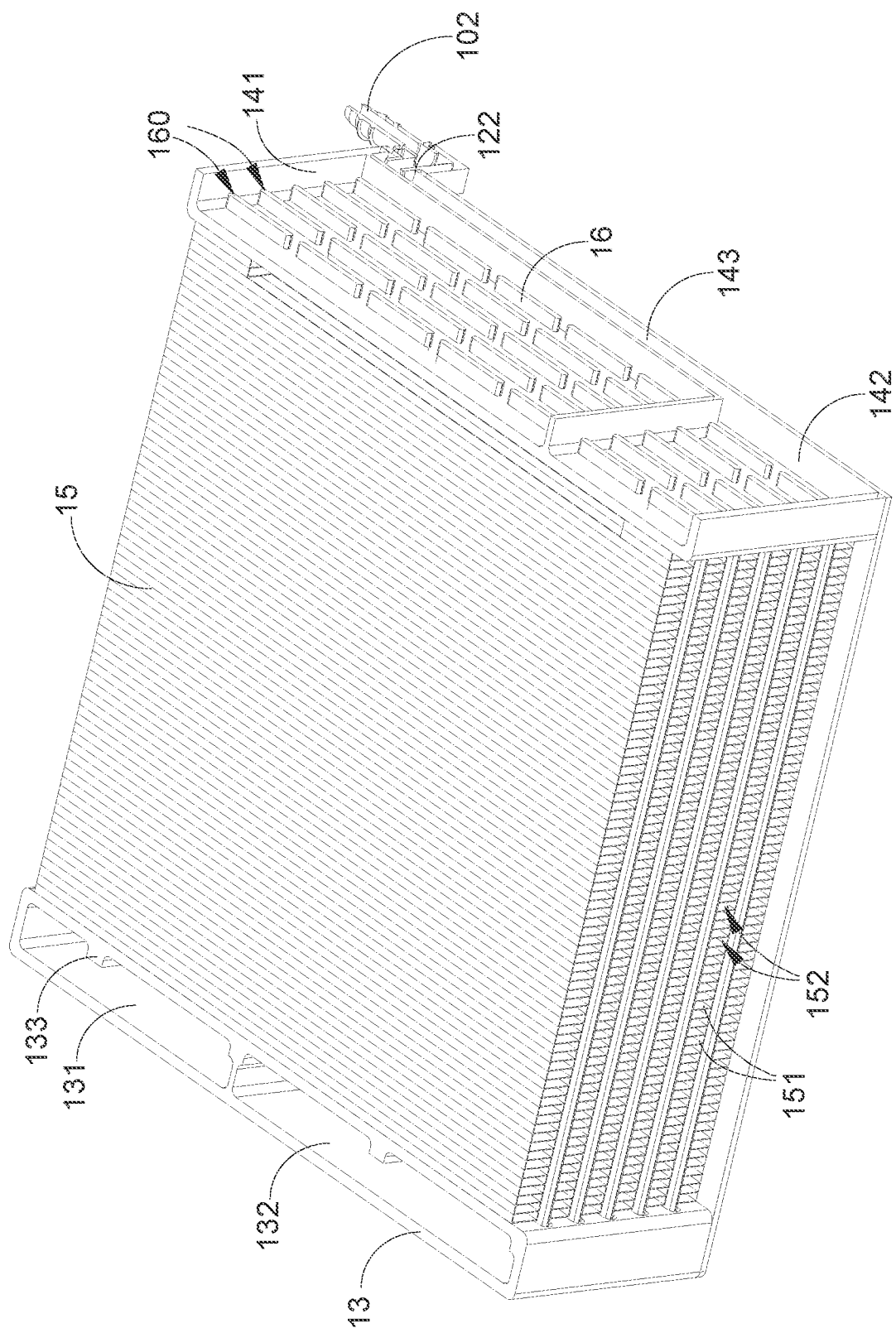
FIG. 3B is a perspective cross-sectional view of the liquid-cooling radiator module being sectioned from another side of the liquid-cooling radiator module.
Figure 3C:
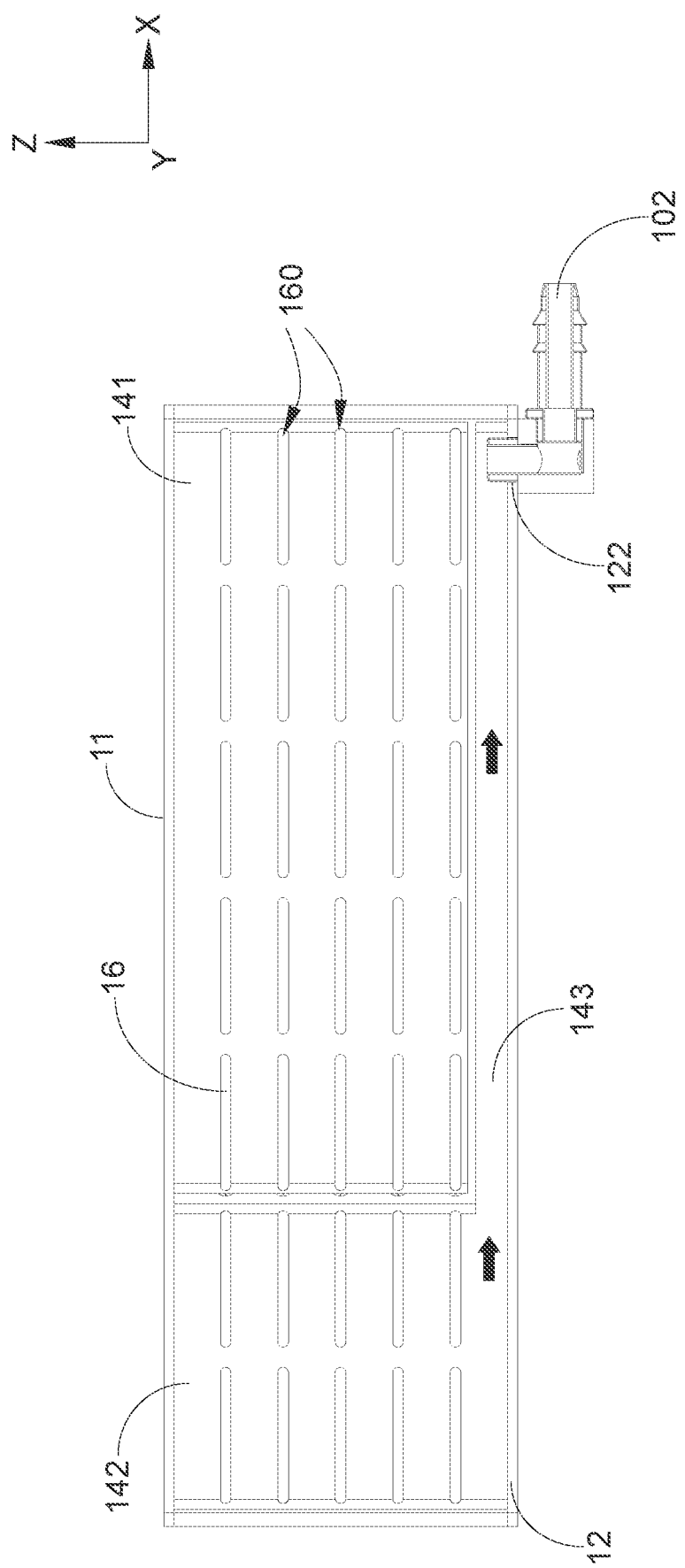
FIG. 3C is a side view of FIG. 3B.

Reference is now made to FIG. 1A to FIG. 3C, in which FIG. 1A is a perspective view of a liquid-cooling radiator module 1 according to one embodiment of the present disclosure; FIG. 1B is a perspective view of the liquid-cooling radiator module 1 viewed from another viewing angle according to one embodiment of the present disclosure; FIG. 1C is a top view of the liquid-cooling radiator module 1; FIG. 2A is an exploded view of the liquid-cooling radiator module 1; FIG. 2B is a schematic view of the liquid-cooling radiator module 1 viewed from another viewing angle in FIG. 2A; FIG. 3A is a perspective cross-sectional view of the liquid-cooling radiator module 1 being sectioned from one side of the liquid-cooling radiator module 1; FIG. 3B is a perspective cross-sectional view of the liquid-cooling radiator module 1 being sectioned from another side of the liquid-cooling radiator module 1; and FIG. 3C is a side view of FIG. 3B.

As shown in FIG. 1A to FIG. 2B, the liquid-cooling radiator module 1 of the embodiment includes an upper cover 11, a lower cover 12, a first reservoir 13, a second reservoir 14, a heat dissipation stacked structure 150, a radiator inlet 101 and a radiator outlet 102. The first reservoir 13 (e.g., a tank or a container) is sandwiched between the upper cover 11 and the lower cover 12. The second reservoir 14 (e.g., a tank or a container) is sandwiched between the upper cover 11 and the lower cover 12; in other words, the first reservoir 13 and the second reservoir 14 are collectively sandwiched between the upper cover 11 and the lower cover 12, so that the first reservoir 13 and the second reservoir 14 are respectively located at two opposite sides of the heat dissipation stacked structure 150. A long axis direction (e.g., X axis) of the second reservoir 14 is parallel to a long axis direction of the first reservoir 13 (e.g., X axis). The heat dissipation stacked structure 150 is sandwiched between the upper cover 11 and the lower cover 12, and between the first reservoir 13 and the second reservoir 14. The heat dissipation stacked structure 150 includes a plurality of fin tube layers 160 and a plurality of heat dissipation fin sets 15 in which the fin tube layers 160 and the heat dissipation fin sets 15 are sandwiched between the first reservoir 13 and the second reservoir 14. The overlapped arrangement of the fin tube layers 160 and the heat dissipation fin sets 15 is that each of the heat dissipating fin sets 15 is stacked with one of the fin tube layers 160 so as to form multiple layers which are stacked one another. In other words, the fin tube layers 160 are stacked one another, and the heat dissipation fin sets 15 are stacked one another. Each of the fin tube layers 160 is stacked between any two neighboring ones of the heat dissipating fin sets 15. The fin tube layers 160 includes a plurality of fin tubes 16 which are parallel to each other, that is, the long axis directions (e.g., Y axis) of the fin tubes 16 are parallel to each other. A long axis direction (e.g., Y axis) of each of the fin tubes 16 is orthogonal to a long axis direction (e.g., X axis) of the first reservoir 13. However, the present disclosure is not limited thereto. In other embodiments, the heat dissipating fin sets, the upper cover or/and the lower cover may be omitted.

A plurality of through holes 130 are formed on an inner side of the first reservoir 13, and a plurality of through holes 140 are formed on an inner side of the first reservoir 13. The through holes 130/140 are respectively corresponded to the fin tubes 16 so that the fin tubes 16 are able to insert into the corresponding through holes 130 to communicate with the first reservoir 13, and insert into the corresponding through holes 140 to communicate with the second reservoir 14. The through holes 130 shown in the embodiment are arranged in an array having five layers in which each of the five layers has seven through holes 130. The through holes 140 shown in the embodiment are arranged in an array having five layers in which each of the five layers has seven through holes 140. The fin tubes 16 are also arranged in an array having five layers in which each of the five layers has seven fin tubes 16. Furthermore, the multiple layers of the heat dissipating fin sets 15 have six layers. It can be understood that the concept of the present disclosure is not limited to this.

In the embodiment, an airflow direction of each of the heat dissipation fin sets 15 is parallel to a long axis direction of the first reservoir 13 (e.g., X axis), and a long axis direction of the second reservoir 14 (e.g., X axis). The axis direction (e.g., Y axis) of the orifice of each of the fin tubes 16 is perpendicular to the long axis direction of the first reservoir 13 and the long axis direction of the second reservoir 14 (e.g., X axis), that is, the airflow direction (e.g., X axis) of each of the heat dissipation fin sets 15 is perpendicular to the axis direction (e.g., Y axis) of the orifice of each of the fin tubes 16. The first reservoir 13 and the second reservoir 14 are respectively located at two opposite sides of the heat dissipation fin sets 15 to sandwich the heat dissipation fin sets 15, and another two opposite sides of the heat dissipation fin sets 15 not sandwiched by the first reservoir 13 and the second reservoir 14 will be exposed outwardly, so that external airflow can be leaded into the heat dissipation fin sets 15 for cooling the working fluid (e.g., liquid water) filled within the fin tubes 16. One side of the heat dissipation fin sets 15 having the radiator inlet 101 and the radiator outlet 102 is illustrated as an outlet side of the heat dissipation fin sets 15, and the other side of the heat dissipation fin sets 15 opposite to the outlet side is illustrated as an inlet side of the heat dissipation fin sets 15. In other words, each of the heat dissipation fin sets 15 includes a plurality of fins 151 which are spaced arranged one another. An airflow channel 152 is formed between any two neighboring ones of the fins 151, and a long axis direction (e.g., X axis) of each of the airflow channel 152 is parallel to a long axis direction (e.g., X axis) of the first reservoir 13. In addition, in this embodiment, the liquid-cooling radiator module is, for example, a water-cooled or oil-cooled liquid-cooling radiator module. However, the present disclosure is not limited to thereto.

Each of the radiator inlet 101 and the radiator outlet 102 in this embodiment is illustrated as a nozzle that is protruded outwardly and provided with a relatively small diameter. The lower cover 12 is formed with a first opening 121 and a second opening 122 in which the radiator inlet 101 is installed to connect to the first opening 121, and the radiator outlet 102 is installed to connect to the second opening 122. In the embodiment, although the radiator inlet 101 and the radiator outlet 102 are respectively illustrated to be protruded outwards from the lower cover 12, however, it is understood that the concept of the present disclosure is not limited to this.

Next, the first reservoir 13 is formed with a first chamber 131 and a second chamber 132. The first chamber 131 and the second chamber 132 are separated to each other and arranged along the long axis direction (e.g., X axis) of the first reservoir 13 in sequence. The second reservoir 14 is formed with a third chamber 141 and a fourth chamber 142. The third chamber 141 and the fourth chamber 142 are separated to each other and arranged along the long axis direction (e.g., X axis) of the second reservoir 14 sequentially. The length of the first chamber 131 is different to the length of the third chamber 141, and the length of the second chamber 132 is different to the length of the fourth chamber 142.

In the embodiment, the first chamber 131 is designed to collectively communicate with the first three of the fin tubes 16 of each layer, and the second chamber 132 is designed to collectively communicate with the last four of the fin tubes 16 of each layer. On the other side, the third chamber 141 is designed to collectively communicate with the first five of the fin tubes 16 of each layer, and the fourth chamber 142 is designed to collectively communicate with the last two of the fin tubes 16 of each layer. However, it is understood that the concept of the present disclosure is not limited to this. The radiator inlet 101 is fluidly communicated with the first chamber 131 for filling working fluid therein from the radiator inlet 101. Thus, after the working fluid flows into the first chamber 131 from the radiator inlet 101, the working fluid flows along a direction illustrated by an arrow in FIG. 1C, that is, the working fluid flows through the first chamber 131, the third chamber 141, the second chamber 132 and the fourth chamber 142 in sequence. Thus, the first chamber 131, a first part of the fin tubes 16, the third chamber 141, a second part of the fin tubes 16, the second chamber 132, a third part of the fin tubes 16 and the fourth chamber 142 are collectively formed to be an S-type flow path between the first reservoir 13 and the second reservoir 14. However, the present disclosure is not limited thereto.

Since the upper cover 11 (refer to FIG. 2A) is omitted in FIGS. 3A and 3B for illustration, thus, as shown in FIG. 3A to FIG. 3C, the fin tubes 16 are shown to be divided into three parts which are named as the aforementioned first part, the aforementioned second part and the aforementioned third part. The aforementioned second part of the fin tubes 16 is located between the aforementioned first part and the aforementioned third part of the fin tubes 16, and the number of the fin tubes 16 may not be equal in the aforementioned first part, the aforementioned second part and the aforementioned third part, respectively. The aforementioned first part of the fin tubes 16 (e.g., three fin tubes) is in communication with the first chamber 131 and the third chamber 141, respectively. The aforementioned second part of the fin tubes 16 (e.g., two fin tubes) is in communication with the third chamber 141 and the second chamber 132. The aforementioned third part of the fin tubes 16 (e.g., two fin tubes) is in communication with the second chamber 132 and the fourth chamber 142. However, the present disclosure is not limited to the number of fin tubes 16 in the first part, second part and third part in the embodiment.

More specifically, in this embodiment, the working fluid flows into the third chamber 141 through the first three of the fin tubes 16 of each layer, and then flows out from the third chamber 141 through the last two of the fin tubes 16 of each layer. Similarly, the working fluid flows into the second chamber 132 through the first two fin tubes 16 of each layer, and then flows out from the second chamber 132 through the last two of the fin tubes 16 of each layer. It is understandable that the number of the fin tubes of each layer can also be modified by other designs in the present disclosure, that is, it is not limited to the examples shown in the above illustrations.

Furthermore, as shown in FIG. 3B and FIG. 3C, in the embodiment, the radiator inlet 101 and the radiator outlet 102 are collectively disposed at the same side of the liquid-cooling radiator module 1. Exemplarily, the radiator inlet 101 and the radiator outlet 102 are collectively disposed at the same side of the lower cover 12. The fourth chamber 142 is fluidly communicated with the outlet channel 143. The outlet channel 143 is separated from the third chamber 141, and located below the third chamber 141. In other words, the outlet channel 143 is located below the third chamber 141. Exemplarily, the outlet channel 143 is located between the lower cover 12 and third chamber 141, and the outlet channel 143 is fluidly communicated with the fourth chamber 142 and the radiator outlet 102. The outlet channel 143 is fluidly communicated with the radiator outlet 102. In this way, after the working fluid flows into the fourth chamber 142 through the corresponding fin tubes 16, the working fluid flows into the outlet channel 143 along a direction illustrated by an arrow in FIG. 3C, and finally flows out of the liquid-cooling radiator module 1 via the radiator outlet 102.

Furthermore, in the embodiment, the first reservoir 13 includes a plurality of reinforcement ribs 133. The reinforcement ribs 133 are spaced arranged on an inner side of the first chamber 131 and an inner side of the second chamber 132 for strengthening the structural strength of the first reservoir 13. However, the present disclosure is not limited to this. In other embodiments, the second reservoir 14 may be equipped with the aforementioned reinforcing ribs 133 as well.

Thus, through the construction of the embodiments above, In addition to achieving good heat dissipation efficiency, the present disclosure is also beneficial to be applied to related computer equipment, host or server equipment.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A liquid-cooling radiator module, comprising:
   a first reservoir comprising a first chamber and a second chamber;
   a second reservoir comprising a third chamber, a fourth chamber and an outlet channel located below the third chamber;
   a heat dissipation stacked structure comprising at least one fin tube layer that is sandwiched between the first reservoir and the second reservoir, and the at least one fin tube layer comprising a plurality of fin tubes which are parallel to each other;
   a radiator inlet connected to the first reservoir and communicated with the first chamber; and
   a radiator outlet located below the third chamber, connected to the second reservoir,
   wherein the outlet channel is in communication with the fourth chamber and the radiator outlet, and a first part of the fin tubes respectively communicates with the first chamber and the third chamber, a second part of the fin tubes respectively communicates with the third chamber and the second chamber, and a third part of the fin tubes respectively communicates with the second chamber and the fourth chamber.

2. The liquid-cooling radiator module of claim 1, wherein the first chamber, the first part of the fin tubes, the third chamber, the second part of the fin tubes, the second chamber, the third part of the fin tubes and the fourth chamber are collectively formed to be an S-type flow path between the first reservoir and the second reservoir.

3. The liquid-cooling radiator module of claim 1, wherein the second part of the fin tubes is located between the first part and the third part of the fin tubes.

4. The liquid-cooling radiator module of claim 1, wherein a length of the first chamber is different to a length of the third chamber, and a length of the second chamber is different to a length of the fourth chamber.

5. The liquid-cooling radiator module of claim 1, wherein the radiator inlet and the radiator outlet are collectively disposed at the same side of the liquid-cooling radiator module.

6. The liquid-cooling radiator module of claim 1, wherein the at least one fin tube layer is plural in number, and the fin tube layers are stacked with each other, wherein a long axis direction of each of the fin tube layers is orthogonal to a long axis direction of the first reservoir.

7. The liquid-cooling radiator module of claim 6, wherein the heat dissipation stacked structure comprises:
   a plurality of heat dissipation fin sets sandwiched between the first reservoir and the second reservoir, and each of the fin tube layers stacked between any two neighboring ones of the heat dissipation fin sets.

8. The liquid-cooling radiator module of claim 7, wherein each of the heat dissipation fin sets comprises a plurality of fins which are spaced apart from one another,
   an airflow channel is formed between any two neighboring ones of the fins, wherein a long axis direction of each of the airflow channel is parallel to a long axis direction of the first reservoir.

9. The liquid-cooling radiator module of claim 1, further comprising:
   an upper cover and a lower cover, wherein the first reservoir, the second reservoir and the at least one fin tube layer of the heat dissipation stacked structure are sandwiched between the upper cover and the lower cover.

10. The liquid-cooling radiator module of claim 1, wherein the first reservoir comprises a plurality of reinforcement ribs, and the reinforcement ribs are spaced arranged on an inner side of the first chamber and an inner side of the second chamber.

* * * * *